(12) United States Patent
Smith (10) Patent No.: US 9,666,735 B2
(45) Date of Patent: May 30, 2017

(54) TRENCH PROCESS AND STRUCTURE FOR BACKSIDE CONTACT SOLAR CELLS WITH POLYSILICON DOPED REGIONS

(71) Applicant: SunPower Corporation, San Jose, CA (US)

(72) Inventor: David D. Smith, Campbell, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 15/230,153

(22) Filed: Aug. 5, 2016

(65) Prior Publication Data

US 2016/0343890 A1  Nov. 24, 2016

Related U.S. Application Data

(60) Continuation of application No. 14/945,931, filed on Nov. 19, 2015, now Pat. No. 9,437,763, which is a
(Continued)

(51) Int. Cl.
*H01L 31/06* (2012.01)
*H01L 31/0224* (2006.01)
(Continued)

(52) U.S. Cl.
CPC ............... *H01L 31/022458* (2013.01); *H01L 31/02008* (2013.01); *H01L 31/028* (2013.01); *H01L 31/02167* (2013.01); *H01L 31/02363* (2013.01); *H01L 31/02366* (2013.01); *H01L 31/022425* (2013.01); *H01L 31/022441* (2013.01); *H01L 31/03682* (2013.01); *H01L 31/035281* (2013.01); *H01L 31/068* (2013.01); *H01L 31/0682* (2013.01); *H01L 31/0745* (2013.01); *H01L 31/0747* (2013.01); *H01L 31/18* (2013.01); *H01L 31/182* (2013.01); *H01L 31/1804* (2013.01); *Y02E 10/546* (2013.01); *Y02E 10/547* (2013.01); *Y02P 70/521* (2015.11)

(58) Field of Classification Search
CPC . H01L 31/18; H01L 31/182; H01L 31/02363; H01L 31/0264
See application file for complete search history.

(56) References Cited

U.S. PATENT DOCUMENTS

4,128,732 A * 12/1978 Kaplow .......... H01L 31/035281
136/246
4,200,472 A * 4/1980 Chappell ............... H01L 31/052
136/246
(Continued)

*Primary Examiner* — Earl Taylor
(74) *Attorney, Agent, or Firm* — Okamoto & Benedicto LLP (57) ABSTRACT

A solar cell includes polysilicon P-type and N-type doped regions on a backside of a substrate, such as a silicon wafer. A trench structure separates the P-type doped region from the N-type doped region. Each of the P-type and N-type doped regions may be formed over a thin dielectric layer. The trench structure may include a textured surface for increased solar radiation collection. Among other advantages, the resulting structure increases efficiency by providing isolation between adjacent P-type and N-type doped regions, thereby preventing recombination in a space charge region where the doped regions would have touched.

17 Claims, 7 Drawing Sheets

Related U.S. Application Data continuation of application No. 14/612,822, filed on Feb. 3, 2015, now Pat. No. 9,231,145, which is a continuation of application No. 14/252,525, filed on Apr. 14, 2014, now Pat. No. 8,975,717, which is a continuation of application No. 13/893,005, filed on May 13, 2013, now Pat. No. 8,772,894, which is a continuation of application No. 12/879,847, filed on Sep. 10, 2010, now Pat. No. 8,460,963, which is a division of application No. 12/431,684, filed on Apr. 28, 2009, now Pat. No. 7,812,250.

(60) Provisional application No. 61/060,921, filed on Jun. 12, 2008.

(51) Int. Cl.
| | |
|---|---|
| *H01L 31/068* | (2012.01) |
| *H01L 31/18* | (2006.01) |
| *H01L 31/0352* | (2006.01) |
| *H01L 31/0216* | (2014.01) |
| *H01L 31/0236* | (2006.01) |
| *H01L 31/0745* | (2012.01) |
| *H01L 31/0747* | (2012.01) |
| *H01L 31/028* | (2006.01) |
| *H01L 31/0368* | (2006.01) |
| *H01L 31/02* | (2006.01) |

(56) References Cited

U.S. PATENT DOCUMENTS

| | | | | |
|---|---|---|---|---|
| 4,989,059 A * | 1/1991 | Micheels | ............... | H01L 21/268 136/255 |
| 5,053,083 A * | 10/1991 | Sinton | ............... | H01L 31/03529 136/255 |
| 5,057,439 A * | 10/1991 | Swanson | ......... | H01L 31/022425 136/256 |
| 5,082,791 A * | 1/1992 | Micheels | ............... | H01L 21/268 136/255 |
| 5,538,564 A * | 7/1996 | Kaschmitter | ..... | H01L 31/03529 136/255 |
| 5,665,175 A * | 9/1997 | Safir | ................... | H01L 21/2255 136/255 |
| 6,211,455 B1 * | 4/2001 | Ford | ................. | H01L 31/03682 136/256 |
| 7,199,395 B2 * | 4/2007 | Terakawa | ............ | H01L 31/0747 257/461 |
| 7,468,485 B1 * | 12/2008 | Swanson | ........... | H01L 31/03682 136/243 |
| 7,474,811 B1 * | 1/2009 | Quitoriano | ............. | B82Y 20/00 385/129 |
| 7,812,250 B2 * | 10/2010 | Smith | ............. | H01L 31/022441 136/255 |
| 7,851,698 B2 * | 12/2010 | De Ceuster | ..... | H01L 31/022441 136/255 |
| 8,134,217 B2 * | 3/2012 | Rim | ...................... | H01L 29/861 257/431 |
| 8,207,444 B2 * | 6/2012 | Cousins | .......... | H01L 31/022433 136/252 |
| 8,450,134 B2 * | 5/2013 | De Ceuster | ..... | H01L 31/022441 136/257 |
| 8,460,963 B2 * | 6/2013 | Smith | ............. | H01L 31/022441 136/257 |
| 8,580,599 B2 * | 11/2013 | Rim | ...................... | H01L 29/861 257/E27.123 |
| 8,772,894 B2 * | 7/2014 | Smith | ............. | H01L 31/022441 136/255 |
| 8,975,717 B2 * | 3/2015 | Smith | ............. | H01L 31/022441 136/255 |
| 9,231,145 B2 * | 1/2016 | Smith | ............. | H01L 31/022441 |
| 9,437,763 B2 * | 9/2016 | Smith | ............. | H01L 31/022441 |
| 2005/0062041 A1 * | 3/2005 | Terakawa | ............ | H01L 31/0747 257/53 |
| 2006/0060238 A1 * | 3/2006 | Hacke | ................... | H01L 31/068 136/256 |
| 2009/0308438 A1 * | 12/2009 | De Ceuster | ..... | H01L 31/022441 136/255 |
| 2009/0308457 A1 * | 12/2009 | Smith | ............. | H01L 31/022441 136/261 |
| 2010/0000597 A1 * | 1/2010 | Cousins | .......... | H01L 31/022433 136/255 |
| 2010/0139764 A1 * | 6/2010 | Smith | ................... | H01L 31/182 136/256 |
| 2010/0289103 A1 * | 11/2010 | Yamamoto | ............ | H01L 31/105 257/458 |
| 2011/0003423 A1 * | 1/2011 | Smith | ............. | H01L 31/022441 438/71 |
| 2011/0059571 A1 * | 3/2011 | De Ceuster | ..... | H01L 31/022441 438/71 |
| 2011/0062416 A1 * | 3/2011 | Wang | .................... | B82Y 20/00 257/14 |
| 2012/0000522 A1 * | 1/2012 | Dennis | ............. | H01L 31/02363 136/256 |

\* cited by examiner

TRENCH PROCESS AND STRUCTURE FOR BACKSIDE CONTACT SOLAR CELLS WITH POLYSILICON DOPED REGIONS

CROSS-REFERENCE TO RELATED APPLICATIONS

This application is a continuation of U.S. application Ser. No. 14/945,931, filed on Nov. 19, 2015, which is a continuation of U.S. application Ser. No. 14/612,822, filed on Feb. 3, 2015, now U.S. Pat. No. 9,231,145, which is a continuation of U.S. application Ser. No. 14/252,525, filed on Apr. 14, 2014, now U.S. Pat. No. 8,975,717, which is a continuation of U.S. application Ser. No. 13/893,005, filed on May 13, 2013, now U.S. Pat. No. 8,772,894, which is a continuation of U.S. application Ser. No. 12/879,847, filed on Sep. 10, 2010, now U.S. Pat. No. 8,460,963, which is a divisional of U.S. application Ser. No. 12/431,684, filed on Apr. 28, 2009, now U.S. Pat. No. 7,812,250, which claims the benefit of U.S. Provisional Application No. 61/060,921, filed on Jun. 12, 2008, all of which are incorporated herein by reference in their entirety.

BACKGROUND OF THE INVENTION

1. Field of the Invention

The present invention relates generally to solar cells, and more particularly but not exclusively to solar cell fabrication processes and structures.

2. Description of the Background Art

Solar cells are well known devices for converting solar radiation to electrical energy. They may be fabricated on a semiconductor wafer using semiconductor processing technology. A solar cell includes P-type and N-type doped regions. Solar radiation impinging on the solar cell creates electrons and holes that migrate to the doped regions, thereby creating voltage differentials between the doped regions. In a backside contact solar cell, both the doped regions and the interdigitated metal contact fingers coupled to them are on the backside of the solar cell. The contact fingers allow an external electrical circuit to be coupled to and be powered by the solar cell.

Efficiency is an important characteristic of a solar cell as it is directly related to the solar cell's capability to generate power. Accordingly, techniques for increasing the efficiency of solar cells are generally desirable. The present invention allows for increased solar cell efficiency by providing processes for fabricating novel solar cell structures.

SUMMARY

In one embodiment, a solar cell includes polysilicon P-type and N-type doped regions on a backside of a substrate, such as a silicon wafer. A trench structure separates the P-type doped region from the N-type doped region. Each of the P-type and N-type doped regions may be formed over a thin dielectric layer. The trench structure may include a textured surface for increased solar radiation collection. Among other advantages, the resulting structure increases efficiency by providing isolation between adjacent P-type and N-type doped regions, thereby preventing recombination in a space charge region where the doped regions would have touched.

These and other features of the present invention will be readily apparent to persons of ordinary skill in the art upon reading the entirety of this disclosure, which includes the accompanying drawings and claims.

The use of the same reference label in different figures indicates the same or like components. The figures are not drawn to scale.

DETAILED DESCRIPTION

In the present disclosure, numerous specific details are provided, such as examples of materials, process parameters, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

In solar cells with P-type and N-type doped regions in the substrate, the P-type and N-type doped regions may be formed with separate or abutting perimeters. The inventor discovered, however, that this is not true with polysilicon doped regions because recombination in the space charge region where the polysilicon doped regions touch is very high due to the lifetime of charge carriers in the polysilicon being very low. That is, the inventor discovered that touching polysilicon doped regions adversely affect efficiency. Embodiments of the present invention address this problem associated with polysilicon doped regions and formed doped regions in general.

Figure 1:
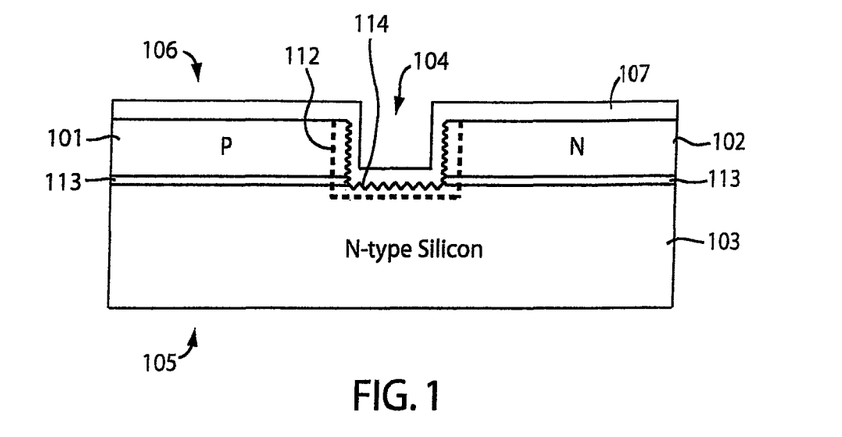
FIGS. 1 and 2 show a solar cell structure in accordance with an embodiment of the present invention.

FIG. 1 schematically shows a sectional view of a solar cell structure in accordance with an embodiment of the present invention. In the example of FIG. 1, the solar cell is a backside contact solar cell in that its doped regions 101 and 102 are on the backside 106 opposite to the front side 105. The front side 105 faces the sun during normal operation. The doped regions 101 and 102 are formed on a thin dielectric layer 113. The dielectric layer 113 may be formed to a thickness of 5 Angstroms to 40 Angstroms. In one embodiment, the dielectric layer 113 comprises silicon dioxide thermally grown on the surface of the substrate 103 to a thickness of 20 Angstroms. The dielectric layer 113 may also comprise silicon nitride. The dielectric layer 113 advantageously allows for surface passivation. The polysilicon of the doped regions 101 and 102 applies an electric field across the dielectric layer 113, which repels minority carriers and accumulates majority carriers at the dielectric interface.

In the example of FIG. 1, the doped region 101 is a P-type doped region, while the doped region 102 is an N-type doped region. A substrate 103 comprises an N-type silicon wafer in this example. As can be appreciated, the substrate 103 may also comprise a P-type silicon or other wafer with appropriate changes to the rest of the structure. There are several P-type and N-type doped regions in any given solar cell but only one of each is shown in FIG. 1 for clarity of illustration.

The doped regions 101 and 102 may comprise doped polysilicon formed to a thickness of about 2000 Angstroms by low pressure chemical vapor deposition (LPCVD). The doped region 101 may comprise polysilicon doped with a P-type dopant (e.g., boron) and the doped region 102 may comprise polysilicon doped with an N-type dopant (e.g., phosphorus). The polysilicon may be deposited over the thin dielectric layer 113 and then doped by diffusion. The polysilicon may also be pre-doped prior to deposition on the dielectric layer 113. Polysilicon is the preferred material for the doped regions 101 and 102 for its compatibility with high temperature processing, allowing for increased thermal budget.

As shown in FIG. 1, the doped regions 101 and 102 are separated by a trench 104, which serves as a gap between the doped regions 101 and 102.

The trench 104 may be formed by laser trenching or conventional etching, for example. In one embodiment, the trench 104 is about 100 microns wide. The trench 104 may be formed before or after a diffusion step that dopes the polysilicon doped regions 101 and 102. If the trench 104 is formed before the diffusion step, the passivation region 112 may comprise an N-type passivation region formed during the diffusion step.

In one embodiment, the trench 104 is formed using a process that not only forms the trench 104 but also forms a randomly textured surface 114 on the surface of the trench 104. The randomly textured surface 114 improves solar radiation collection of light incident on the back of the solar cell, i.e. a bifacial configuration. A wet etch process comprising potassium hydroxide and isopropyl alcohol may be used to form the trench 104 and to texture the surface 114 with random pyramids. The trench 104 may be formed to dig 1 to 10 microns (e.g., 3 microns) into the substrate 103.

A dielectric in the form of a silicon nitride 107 is deposited in the trench 104. The silicon nitride 107 preferably has a relatively large positive fixed charge density to place the silicon surface under the trench 104 in accumulation and to provide good surface passivation. The positive fixed charge density of the silicon nitride 107 may naturally occur as part of the deposition process used to form the silicon nitride 107. In one embodiment, the silicon nitride 107 is formed to a thickness of about 400 Angstroms by plasma enhanced chemical vapor deposition (PECVD). The resulting accumulation layer repels minority carriers, i.e. positively charged holes in N-type material. The trench 104 also prevents the space charge region from developing in the polysilicon. Instead, the space charge develops in the single crystal silicon underneath the P-type polysilicon. In this region, lifetime is not reduced due to grain boundaries, and hence the parasitic recombination is suppressed. A portion of this space charge region also intersects the surface of the wafer in the trench 104. The positive charge in the silicon nitride 107 reduces the impact of this region of space charge region as well narrowing the region.

An example process flow for fabricating the solar cell structure of FIG. 1 may include forming a thin dielectric layer 113 over a backside surface of the substrate 103, forming an undoped polysilicon layer over the thin dielectric layer 113, doping the polysilicon layer into P-type and N-type doped regions 101 and 102, etching the doped polysilicon layer to form the trench 104 and the textured surface 114, forming the passivation region 112, and forming the silicon nitride 107 in the trench 104. Rather than diffusing dopants on an undoped polysilicon layer, the doped regions 101 and 102 may also be formed by depositing pre-doped polysilicon on the dielectric layer 113 using conventional deposition, masking, and etching techniques. The silicon nitride 107 preferably has a planar, as opposed to textured, surface. However, the planarity of the silicon nitride 107 is not critical and no additional planarization step is needed. For example, the planarity of the silicon nitride 107 may be as deposited. The trench 104 may be formed before or after doping of the doped regions 101 and 102.

Figure 2:
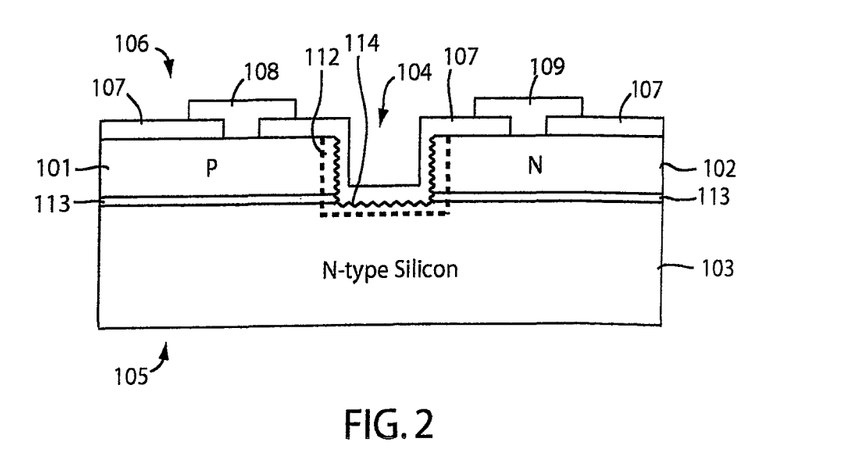

Referring to FIG. 2, interdigitated metal contact fingers 108 and 109 may be formed through the silicon nitride 107 to make an electrical connection to the doped regions 101 and 102, respectively. External electrical circuits may be attached to the interdigitated metal contact fingers 108 and 109 to connect to and be powered by the solar cell. In the example of FIG. 2, the metal contact finger 108 may be connected to a positive electrical terminal and the metal contact finger 109 may be connected to a negative electrical terminal.

The trench structure of FIG. 1 addresses the aforementioned issues relating to polysilicon parasitic space charge recombination several ways. Firstly, the trench 104 separates the doped regions 101 and 102 so they are not physically in contact. This prevents the space charge region from existing in either polysilicon film. Secondly, the resulting accumulation layer under the trench 104 repels minority carriers to improve surface passivation. Thirdly, the textured surface 114 in the trench 104 increases solar radiation collection. These advantageously help increase solar cell efficiency.

FIGS. 3-10 show sectional views illustrating the fabrication of a solar cell in accordance with an embodiment of the present invention. There are a plurality of P-type doped regions and N-type doped regions in a solar cell but only one of each is shown as being fabricated in the following example for clarity of illustration.

Figure 3:
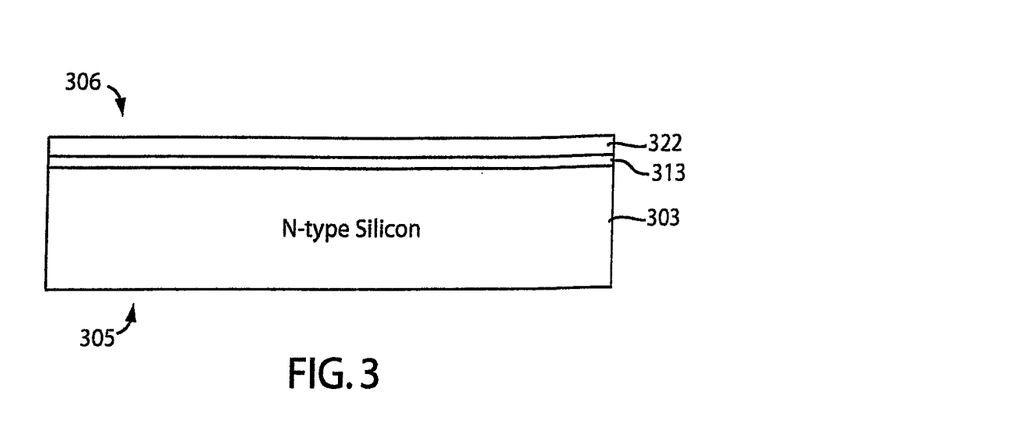
FIGS. 3, 4, 5, 6, 7A, 8A, 7B, 8B, 9 and 10 illustrate the fabrication of a solar cell in accordance with an embodiment of the present invention.
Figure 4:
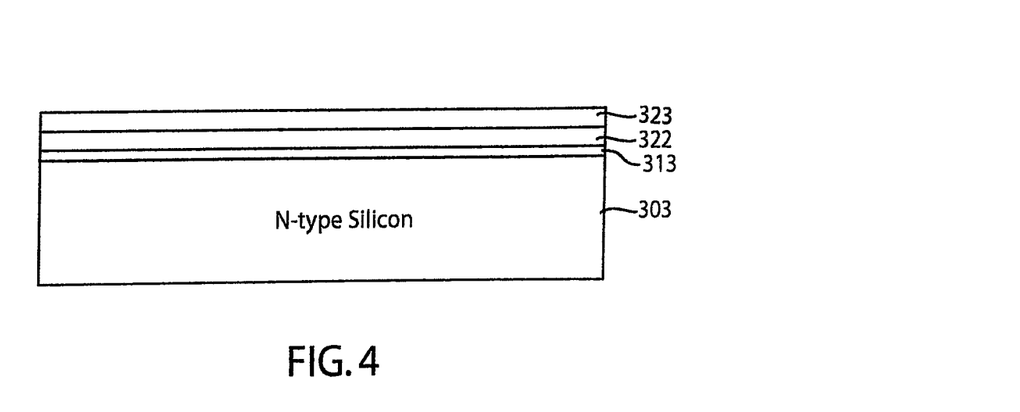
Figure 5:
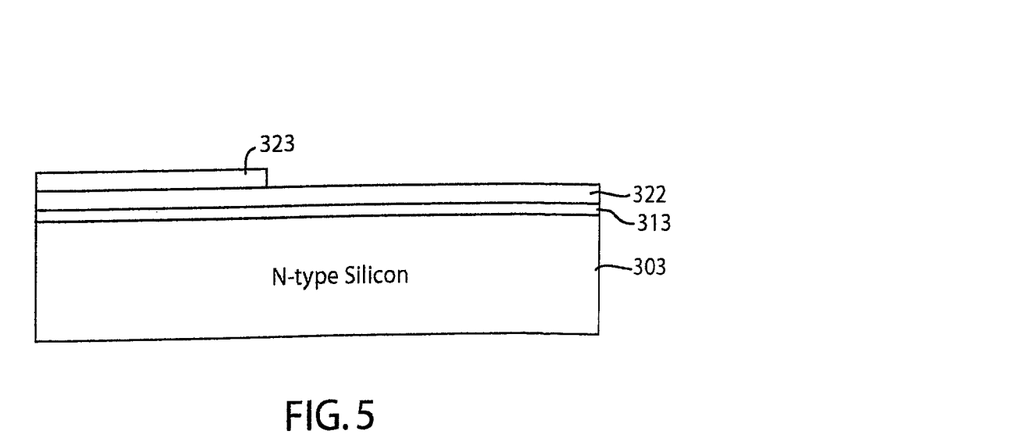

The embodiment of FIGS. 3-10 begins with formation of a thin dielectric layer 313 on a backside surface of a substrate 303 (FIG. 3). The substrate 303 may comprise an N-type silicon wafer, for example. The dielectric layer 313 may be formed to a thickness of 5 Angstroms to 40 Angstroms (e.g., 20 Angstroms). In one embodiment, the dielectric layer 313 comprises silicon dioxide thermally grown on the surface of the substrate 103. The dielectric layer 313 may also comprise silicon nitride, for example. An undoped polysilicon layer 322 is then formed on the dielectric layer 313. The polysilicon layer 322 may be formed to a thickness of about 2000 Angstroms by LPCVD, for example. A doped silicon dioxide layer 323 is then formed over the polysilicon layer 322 (FIG. 4). The silicon dioxide layer 323 serves as a dopant source for a subsequently formed doped region, which is a P-type doped region 301 in this example (see FIG. 7A or 8B). The silicon dioxide layer 323 may thus be doped with a P-type dopant, such as boron. The doped silicon dioxide layer 323 is patterned to remain over an area of the polysilicon layer 322 where the P-type doped region 301 is to be formed (FIG. 5). The silicon dioxide layer 323 may be formed to a thickness of about 1000 Angstroms by APCVD.

Figure 6:
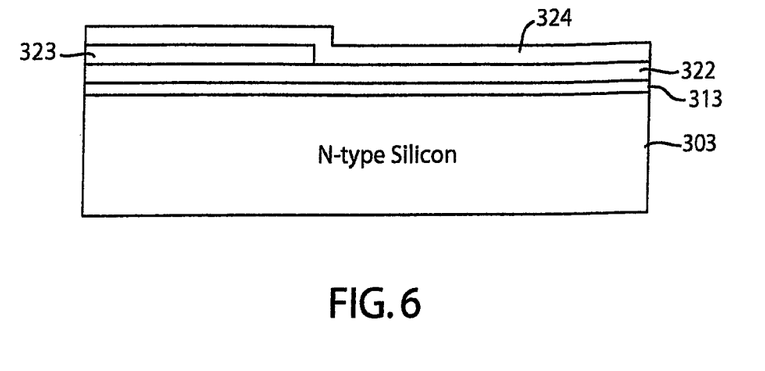

A doped silicon dioxide layer 324 is formed over the silicon dioxide 323 and the polysilicon layer 322 (FIG. 6). The silicon dioxide 324 serves as a dopant source for a subsequently formed doped region, which is an N-type doped region 302 in this example (see FIG. 7A or 8B). The silicon dioxide 324 may thus be doped with an N-type dopant, such as phosphorus. The silicon dioxide 324 may be formed to a thickness of about 2000 Angstroms by APCVD.

Figure 7A:
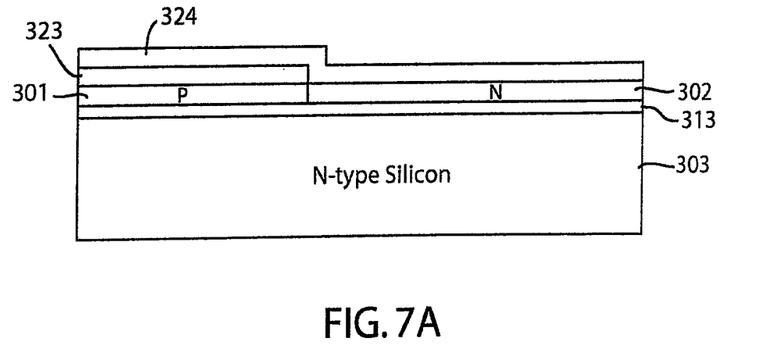
Figure 7B:
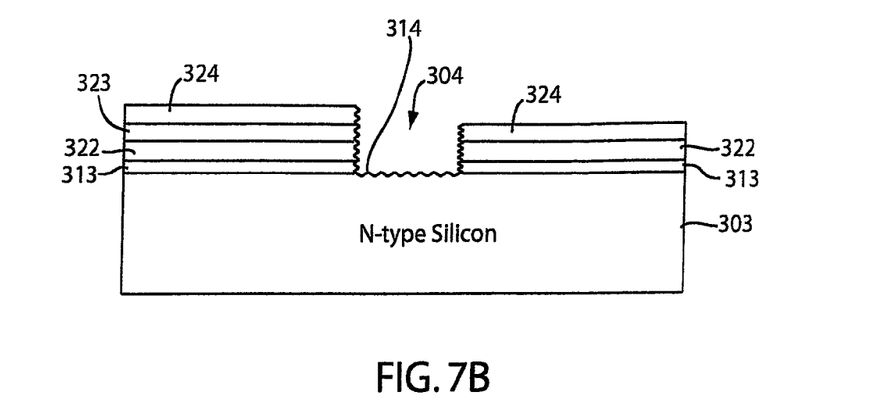
Figure 8A:
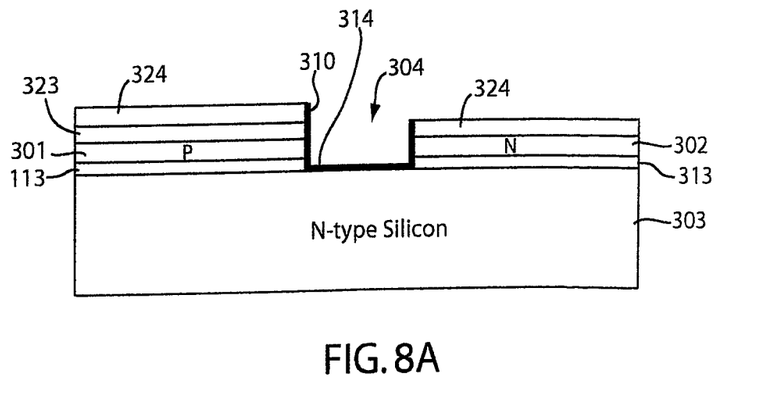
Figure 8B:
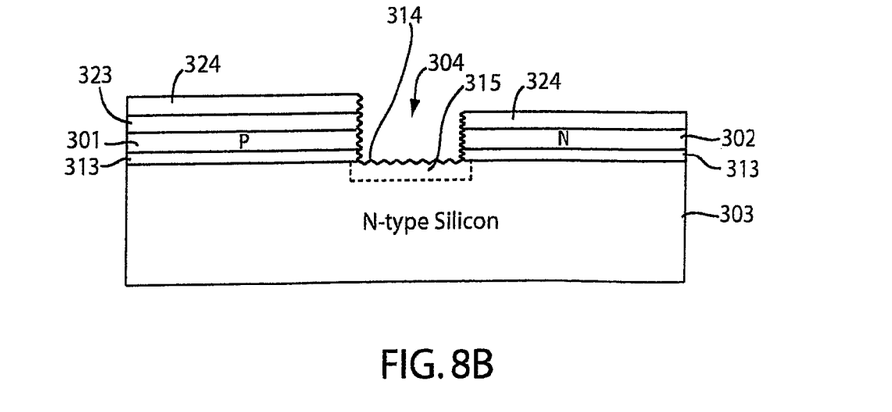

The trench separating the doped regions may be formed before formation of the doped regions in a first trench formation process or after formation of the doped regions in a second trench formation process. FIGS. 7A and 8A illustrate process steps for the first trench formation process, while FIGS. 7B and 8B illustrate process steps for the second trench formation process. Both trench formation processes may proceed from FIG. 6 and continue on to FIG. 9.

In the first trench formation process, a thermal drive-in step diffuses dopants from the silicon dioxides 323 and 324 to the underlying polysilicon layer 322, thereby forming P-type and N-type doped regions in the polysilicon layer 322, which is accordingly relabeled as P-type doped region 301 and N-type doped region 302 (FIG. 7A). The thermal drive-in step may be performed by heating the sample of FIG. 6. The preferred drive conditions give a heavily doped, e.g., greater than $1e^{20}$ cm$^{-3}$, polysilicon layer that is uniform throughout the thickness of the film and has very little doping under the polysilicon, e.g., equal to or less than $1e^{18}$ cm$^{-3}$. The thermal drive-in step results in the polysilicon layer 322 under the silicon dioxide 323 forming the P-type doped region 301 and polysilicon layer 322 under the silicon dioxide 324 forming the N-type doped region 302.

The silicon dioxide 324, silicon dioxide 323, doped region 301, doped region 302, and thin dielectric layer 313 are etched to form a trench 304 (FIG. 8A). The trench etch may comprise a multi-step etch process, with the last etch step stopping on the substrate 303. The trench 304 may be about 100 microns wide, for example. However, there is no known limit to the minimum width as long as the P-type doped region 301 and N-type doped region 302 do not contact each other. The trench 304 may be formed by conventional etching processes including by laser trenching. In one embodiment, the trench 304 has a textured surface 314 for improved solar radiation collection efficiency. In one embodiment, a wet etch process comprising potassium hydroxide and isopropyl alcohol is used to form the trench 304 and to texture the surface 314 with random pyramids. The trench 304 may extend 1 to 10 microns, e.g., 3 microns, into the substrate 303.

A thin (less than 200 Angstroms, e.g., 100 Angstroms) passivation layer 310 may be formed on the surface 314 of the trench 304. The passivation layer 310 may comprise silicon dioxide thermally grown on the surface 314 or deposited silicon nitride layer, for example.

In the second trench formation process, the silicon dioxide 324, silicon dioxide 322, and thin dielectric layer 313 of the sample of FIG. 6 are etched to form the trench 304 (FIG. 7B). Textured surface 314 may be formed on the surface of the trench 304. The trench etch is essentially the same as in the first trench formation process except that the trench is formed before formation of the doped regions of the solar cell.

A thermal drive-in step is performed to diffuse dopants from the silicon dioxide layers 323 and 324 to the underlying polysilicon layer 322, thereby forming the doped regions 301 and 302 as in the first trench formation process (FIG. 8B). In this case, in the second trench formation process, a passivation region 315 is formed in the substrate 303 under the trench 304 during the diffusion process. The passivation region 315 may comprise diffused N-type dopants. In one embodiment, the passivation region 315 is formed by introducing POCl3 (phosphorus chloride oxide) in the diffusion furnace during the thermal drive-in. The passivation region 315 serves the same function as the passivation region 112 of FIG. 1.

In both the first and second trench formation processes, the trench 304 serves as a gap physically separating the P-type doped region 301 from the N-type doped region 302. The processing of the solar cell continues from either FIG. 8A or 8B to FIG. 9.

Figure 9:
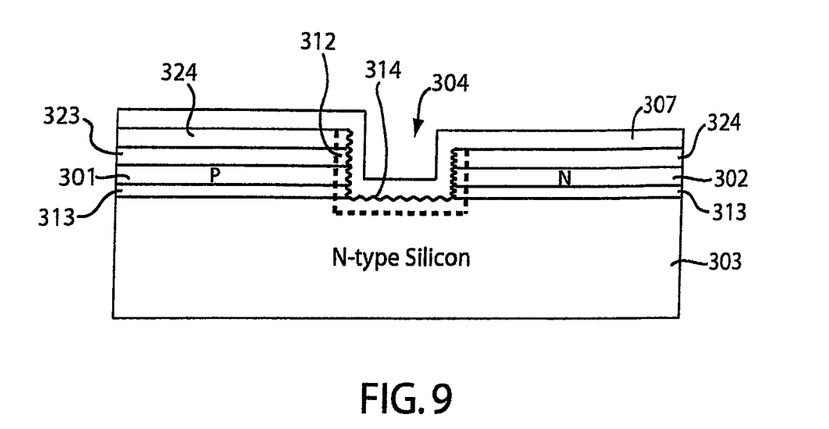
Figure 10:
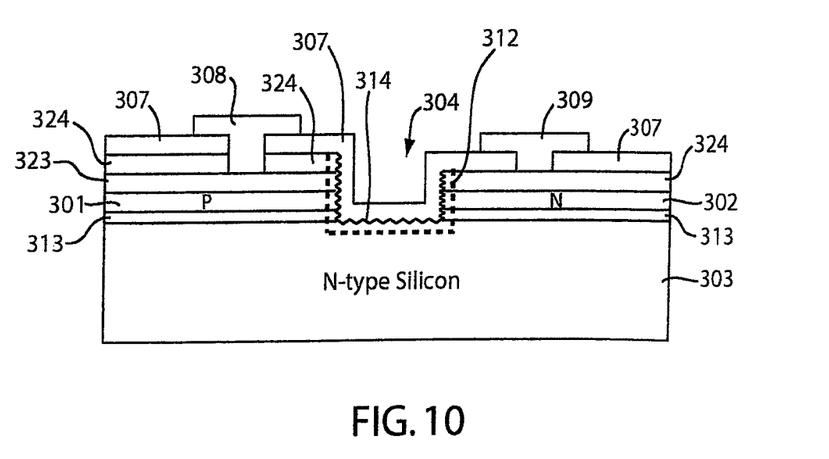

Continuing with FIG. 9, a dielectric in the form of a silicon nitride layer 307 is formed in the trench 304. In the example of FIG. 9, the silicon nitride layer 307 is also formed over the layers 323 and 324. The silicon nitride layer 307 preferably has a relatively large positive fixed charge density to place the silicon surface under the trench 304 in accumulation and to provide good surface passivation. The positive fixed charge density on the silicon nitride layer 307 may naturally occur as part of a PECVD process, for example. In one embodiment, the silicon nitride 307 is formed to a thickness of about 400 Angstroms by PECVD. The silicon nitride 307 preferably has a planar (e.g., as deposited) surface. In FIGS. 9 and 10, the passivation region 312 represents either the passivation layer 310 (see FIG. 8A) or the passivation region 315 (see FIG. 8B) depending on the trench formation process used.

Interdigitated metal contact fingers 308 and 309 may then be formed through the silicon nitride 307 to make an electrical connection to the doped regions 301 and 302 by way of layers 323 and 324, respectively (FIG. 10). External electrical circuits may be attached to the interdigitated metal contact fingers 308 and 309 to connect to and be powered by the solar cell. In the example of FIG. 10, the metal contact finger 308 may be coupled to a positive electrical terminal and the metal contact finger 309 may be coupled to a negative electrical terminal. The resulting solar cell provides the same benefits as the solar cell of FIG. 1.

Figure 11:
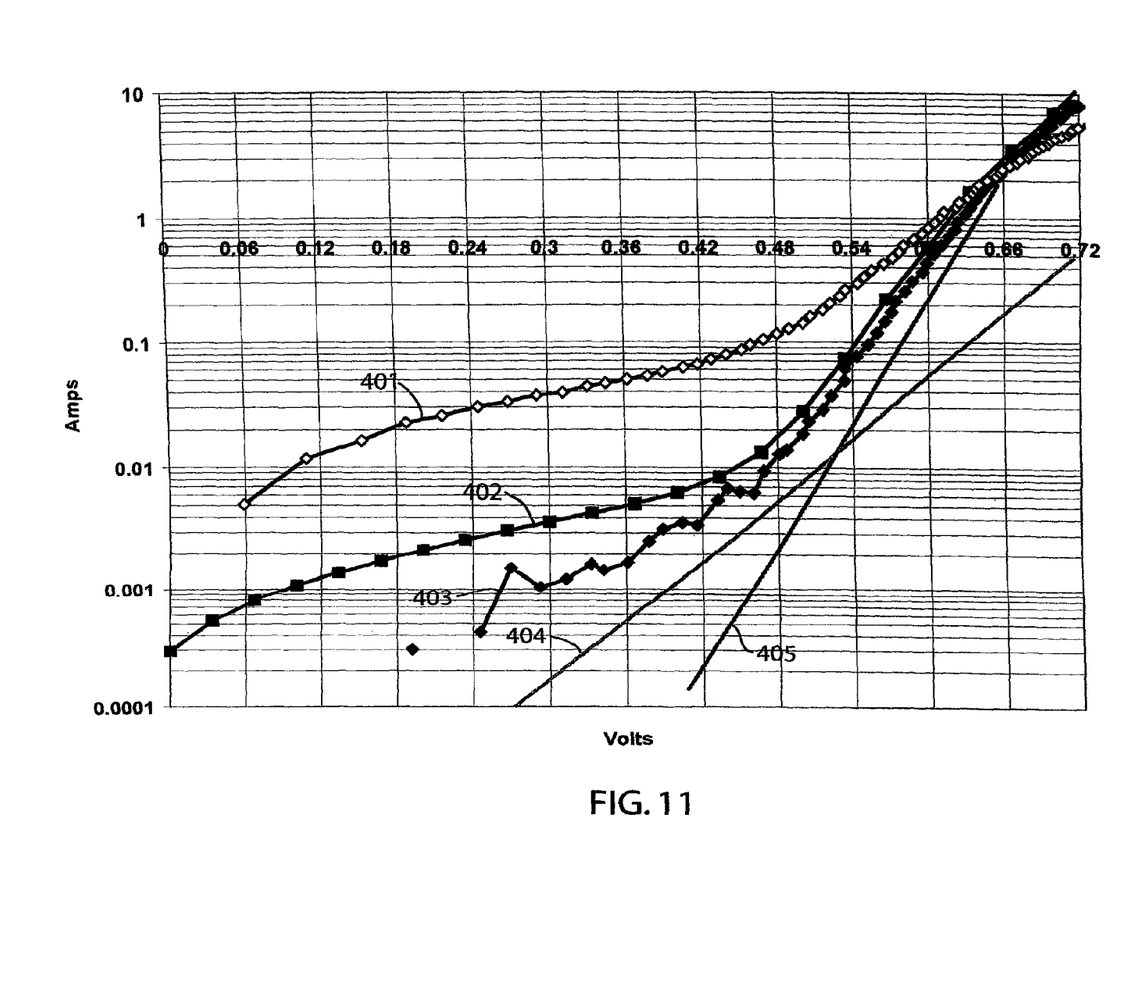
FIG. 11 shows dark I-V curves comparing the performance of a conventional solar cell to a solar cell that is in accordance with an embodiment of the present invention.

FIG. 11 shows dark I-V (i.e., current-voltage) curves comparing the performance of a conventional solar cell to a solar cell that is in accordance with an embodiment of the present invention. The I-V curves are "dark" in that they were measured with no direct solar radiation shining on the solar cells.

The I-V curves are for the diodes formed between an N-type silicon and a P-type doped region. In the example of FIG. 11, the horizontal axis represents voltage across the diode and the vertical axis represents the resulting current across the diode. Plot 401 is the I-V curve for a conventional solar cell with touching P-type and N-type polysilicon doped regions, plot 402 is the I-V curve for a typical Sunpower Corporation A300™ solar cell, and plot 403 is for a solar cell having a trench between the P-type and N-type doped regions as in FIGS. 1 and 9. While the plot 402 is very close to the ideal I-V curve represented by the plot 404, the plot 403 is even closer. The plot 405 represents a guide for the eye of an ideal diode I-V characteristic, the slope of which is 60 millivolts per decade of current.

Figure 12:
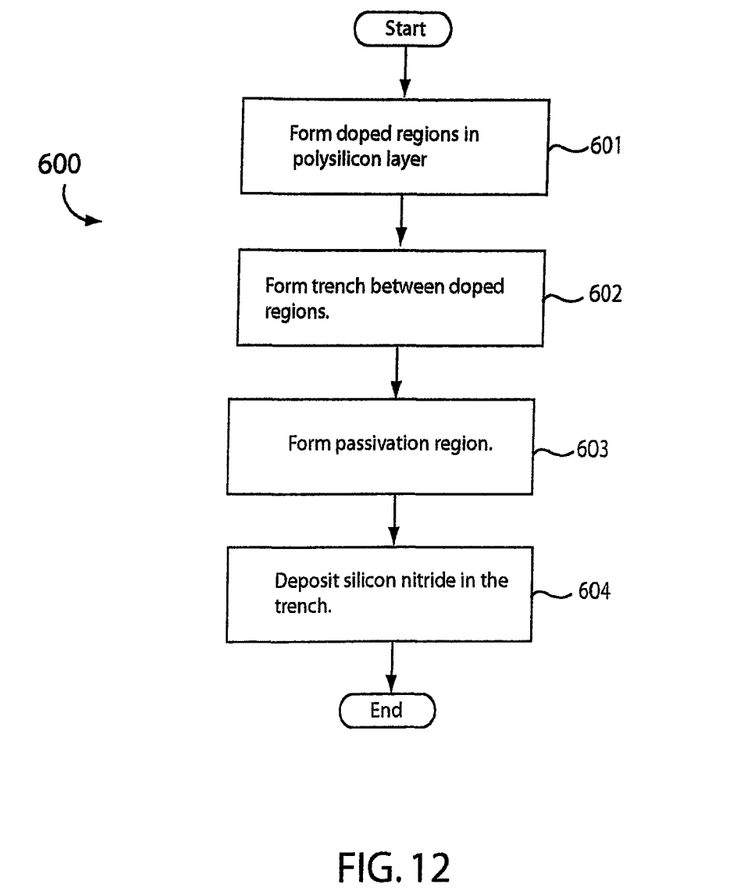
FIG. 12 shows a flow diagram of a method of fabricating a solar cell in accordance with an embodiment of the present invention.

Referring now to FIG. 12, there is shown a flow diagram of a method 600 of fabricating a solar cell in accordance with an embodiment of the present invention. In the method 600, doped regions are formed in a polysilicon layer (step 601). The doped regions may be formed by depositing doped silicon dioxide layers over an undoped polysilicon layer and performing a diffusion step, by depositing pre-doped silicon dioxide layers, or by depositing an undoped polysilicon layer followed by a dopant implantation step, for example. The polysilicon layer where the doped regions are formed may be etched to form a trench separating the P-type doped region from the N-type doped region (step 602). Alternatively, the trench is formed before the doped regions are formed. The trench may include a textured surface for increased solar radiation collection. A passivation region, such as passivation layer or a diffused region in the substrate, may be formed to isolate trench material from the bulk of the substrate (step 603). A dielectric in the form of a silicon nitride layer may then be deposited in the trench (step 604). Interdigitated metal contact fingers may thereafter be formed to electrically connect to the P-type and N-type doped regions through the silicon nitride.

Improved solar cell fabrication processes and structures have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A solar cell comprising:
   a solar cell substrate having a front side configured to face the sun during normal operation and a backside opposite the front side;
   a P-type doped region and an N-type doped region of the solar cell over the backside of the solar cell substrate;
   a trench between the P-type doped region and the N-type doped region, the trench physically separating the P-type doped region from the N-type doped region and extending into the solar cell substrate;
   a first metal contact finger that is electrically connected to the P-type doped region; and
   a second metal contact finger that is electrically connected to the N-type doped region,
   wherein the trench extends into a textured backside surface of the solar cell substrate.

2. The solar cell of claim 1, wherein the P-type doped region and the N-type doped region comprise polysilicon.

3. The solar cell of claim 1, wherein the first metal contact finger and the second metal contact finger are interdigitated.

4. The solar cell of claim 1, wherein the solar cell substrate comprises an N-type silicon wafer.

5. The solar cell of claim 1, further comprising:
   a dielectric layer formed in the trench.

6. The solar cell of claim 5, wherein the first metal contact finger is electrically connected to the P-type doped region through the dielectric layer and the second metal contact finger is electrically connected to the N-type doped region through the dielectric layer.

7. The solar cell of claim 6, wherein the dielectric layer comprises silicon nitride.

8. The solar cell of claim 1, further comprising a passivation region in the solar cell substrate under the trench.

9. A solar cell comprising:
   a P-type doped polysilicon region and an N-type doped polysilicon region on a backside surface of a solar cell substrate;
   a trench between the P-type doped polysilicon region and the N-type doped polysilicon region, the trench physically separating the P-type doped polysilicon region from the N-type doped polysilicon region;
   a first metal contact finger that is electrically connected to the P-type doped polysilicon region;
   a second metal contact finger that is electrically connected to the N-type doped polysilicon region; and
   a dielectric layer formed in the trench,
   wherein the first metal contact finger is electrically connected to the P-type doped polysilicon region through the dielectric layer and the second metal contact finger is electrically connected to the N-type doped polysilicon region through the dielectric layer.

10. The solar cell of claim 9, wherein the trench extends into a textured backside surface of the solar cell substrate.

11. The solar cell of claim 9, wherein the first metal contact finger is interdigitated with the second metal contact finger.

12. The solar cell of claim 9, wherein the solar cell substrate comprises an N-type silicon wafer.

13. The solar cell of claim 9, wherein the dielectric layer comprises silicon nitride.

14. A solar cell comprising:
   a solar cell substrate having a front side configured to face the sun during normal operation and a backside opposite the front side;
   a P-type doped region and an N-type doped region of the solar cell over the backside of the solar cell substrate;
   a trench between the P-type doped region and the N-type doped region, the trench physically separating the P-type doped region from the N-type doped region and extending into the solar cell substrate;
   a dielectric layer over the trench;
   a first metal contact finger that is electrically connected to the P-type doped region through the dielectric layer; and
   a second metal contact finger that is electrically connected to the N-type doped region through the dielectric layer.

15. The solar cell of claim 14, wherein the trench extends into a textured backside surface of the solar cell substrate.

16. The solar cell of claim 14, wherein the P-type doped region and the N-type doped region comprise polysilicon.

17. The solar cell of claim 14, wherein the first metal contact finger and the second metal contact finger are interdigitated.

* * * * *